United States Patent [19]

D'Agostino et al.

[11] Patent Number: 5,331,291
[45] Date of Patent: Jul. 19, 1994

[54] CIRCUIT AND METHOD FOR ADJUSTING THE BIAS OF AN AMPLIFIER BASED UPON LOAD CURRENT AND OPERATING TEMPERATURE

[75] Inventors: Daniel D'Agostino, Orange; David Goodman, Meriden, both of Conn.

[73] Assignee: Krell Industries, Inc., Milford, Conn.

[21] Appl. No.: 992,079

[22] Filed: Dec. 17, 1992

[51] Int. Cl.⁵ .............................................. H03F 1/30
[52] U.S. Cl. ..................................... 330/289; 330/298
[58] Field of Search .................... 330/207 P, 256, 266, 330/272, 289, 298

[56] References Cited

U.S. PATENT DOCUMENTS 3,449,680  6/1969  Schlib et al. .......................... 330/298
4,727,337  2/1988  Jason ..................................... 330/298

Primary Examiner—James B. Mullins
Attorney, Agent, or Firm—Steven V. Reinhardt

[57] ABSTRACT

An electronic circuit for automatically adjusting the operating point of an audio amplifier comprising means for sensing the current flowing in the load, coupled to a first threshold detector, said first threshold detector having a plurality of outputs, each of said outputs representing some fraction of maximum load current; a plurality of timing means, each triggered by one of the plurality of outputs from said first threshold detector, each having a time constant inversely proportional to the fraction of load current represented; means for sensing the operating temperature of the amplifier output stage devices, coupled to a second threshold detector, said second threshold detector having an output which is enabled above a certain temperature and where said output may be used to inhibit one or more of the timer means; means for detecting bias level in a pre-driver stage, coupled to a low pass filter; a error amplifier, whose inputs are coupled to said temperature sense means, said timer outputs and said low pass filter, and whose output is then coupled to the input of said audio amplifier to effect the change in bias.

11 Claims, 3 Drawing Sheets

CIRCUIT AND METHOD FOR ADJUSTING THE BIAS OF AN AMPLIFIER BASED UPON LOAD CURRENT AND OPERATING TEMPERATURE

TECHNICAL FIELD

This invention relates generally to electronic amplifier circuits and, in particular, to the control of a bias signal based upon the operating temperature and load current flowing.

BACKGROUND OF THE INVENTION

This invention relates, in general, to audio power amplifiers, and more particularly, to the adjustment of the operating point of the output stage.

The present invention has utility in adjusting the bias current in an amplifier circuit, particularly in audio amplifiers where it is desired to operate in Class A operation, while minimizing power dissipation.

It is desirable to adjust the output stage bias current in a Class A amplifier so as to insure proper operation without excessive power dissipation. In high power amplifiers, the quiescent current can be quite high, resulting in very high temperatures.

It is common to use some scheme to reduce the quiescent current when there are no or low input signals, so as to reduce the power dissipation. The magnitude of the input signal is commonly utilized. That is, the bias is made proportional to the input signal level; but these schemes can rarely maintain an adequate adjustment range based solely upon the input signal.

It is desirable therefore, to dynamically adjust the bias current so as to maintain operation in Class A operation while minimizing overall power consumption.

Why adjust the output stage bias current rather than maintain a fixed class A bias level for all load conditions? While class A operation is regarded as the best sounding amplifier mode, it is very inefficient. For a pure class A amplifier design the theoretical efficiency is only 25%; the other 75% is dissipated as heat. By definition, however, the output stage bias current need only be equal to the load current. Therefore, by measuring the load current and adjusting the bias current accordingly, class A bias can be maintained without excessive power dissipation.

BRIEF SUMMARY OF THE INVENTION

The present invention provides a means of adjusting the bias signal of an amplifier based upon load current. The circuit was designed to meet two principle requirements: maintain a minimum level of class A bias current through the output stage and eliminate any circuit adjustments in the manufacturing process.

The auto-biasing circuit incorporates several unique features. First, it unobtrusively measures the instantaneous load current. Second, it has multiple selectable and presettable discrete bias levels. Most importantly, each level has a unique hold time which maintains the bias even after the initial trigger signal. This last feature enables the amplifier to maintain class A operation for all subsequent load demands at or below the initial trigger level.

The auto-biasing circuit can also monitor the output stage temperature, and reduce the maximum bias that will be applied in the even that the dissipation in the output stage results in excessive heating.

Accordingly, it is an advantage of the present invention to provide a method and circuit to adjust the bias current of an amplifier based upon the load current.

It is a further advantage of the present invention to be able to maintain a higher than normal bias level for a predetermined time, until the load demands subside.

It is a further advantage of the present invention to be able to reduce the bias current if overheating is detected in the output stage devices.

These and other advantages are achieved in accordance with a preferred embodiment of the invention by providing a circuit and method of adjusting the bias current in an amplifier by measuring the current flowing in the load, determining the magnitude of the load current; triggering timers, whose duration is inversely proportional to the magnitude of the load current, whose outputs are scaled in proportion to the load current; and summed in an error amplifier in combination with a temperature signal derived from the output stage devices, and a bias signal derived from the output of the predriver stage; and that summed signal is supplied to the input of the amplifier to adjust the bias.

BRIEF DESCRIPTION OF THE DRAWINGS

The invention is pointed out with particularity in the appended claims. Other features of the invention will become more apparent and the invention will be best understood by referring to the following detailed description in conjunction with the accompanying drawings in which:

DETAILED DESCRIPTION OF A PREFERRED EMBODIMENT

This section describes how the circuit determines the appropriate bias level and how it handles different operating conditions. On power up, the circuit turns on the lowest bias level in order to warm up the output stage while still dissipating relatively little power. If no new triggers occur before the level one timer times out, the circuit switches to a low power mode (no output bias current). The amplifier will remain in this low power state until it receives a trigger signal based on the load current. Any time that the load current exceeds one of the several trigger levels, the circuit will immediately turn on the corresponding bias level. For all subsequent load currents at or below the present trigger level the amplifier will be in class A operation. If, during the present bias level timing cycle, another trigger signal occurs for this level, the timing cycle is reset. If no trigger occurs during this timing cycle, the circuit switches to the next lower bias level. This "stepping" down cycle continues until a new trigger signal either maintains the present level or advances the bias to a higher level. The timing cycle is shorter for each successive level since, for typical listening levels, the average output current is low. By maintaining each bias level for a specific amount of time, the circuit keeps the amplifier in class A operation for a majority of load demands. If the circuit tried to follow the load demand continuously (as some biasing techniques try to do), the amplifier would operate in class A mode for only a small percentage of load currents.

Since highest two bias levels correspond to relatively high levels of output stage bias current, the circuit has an over temperature protection mode. If the amplifier's main heat sinks reach a preset temperature, the protection circuit disables the highest bias levels. This will allow the amplifier to cool to a safe temperature, at which point the circuit will re-enable these bias levels.

The circuit consists of three different systems: a bias measurement and control system, a temperature measurement system, and an output current monitoring and bias level select system. Please refer to FIG. 1 through FIG. 4 for the following discussion.

Figure 1:
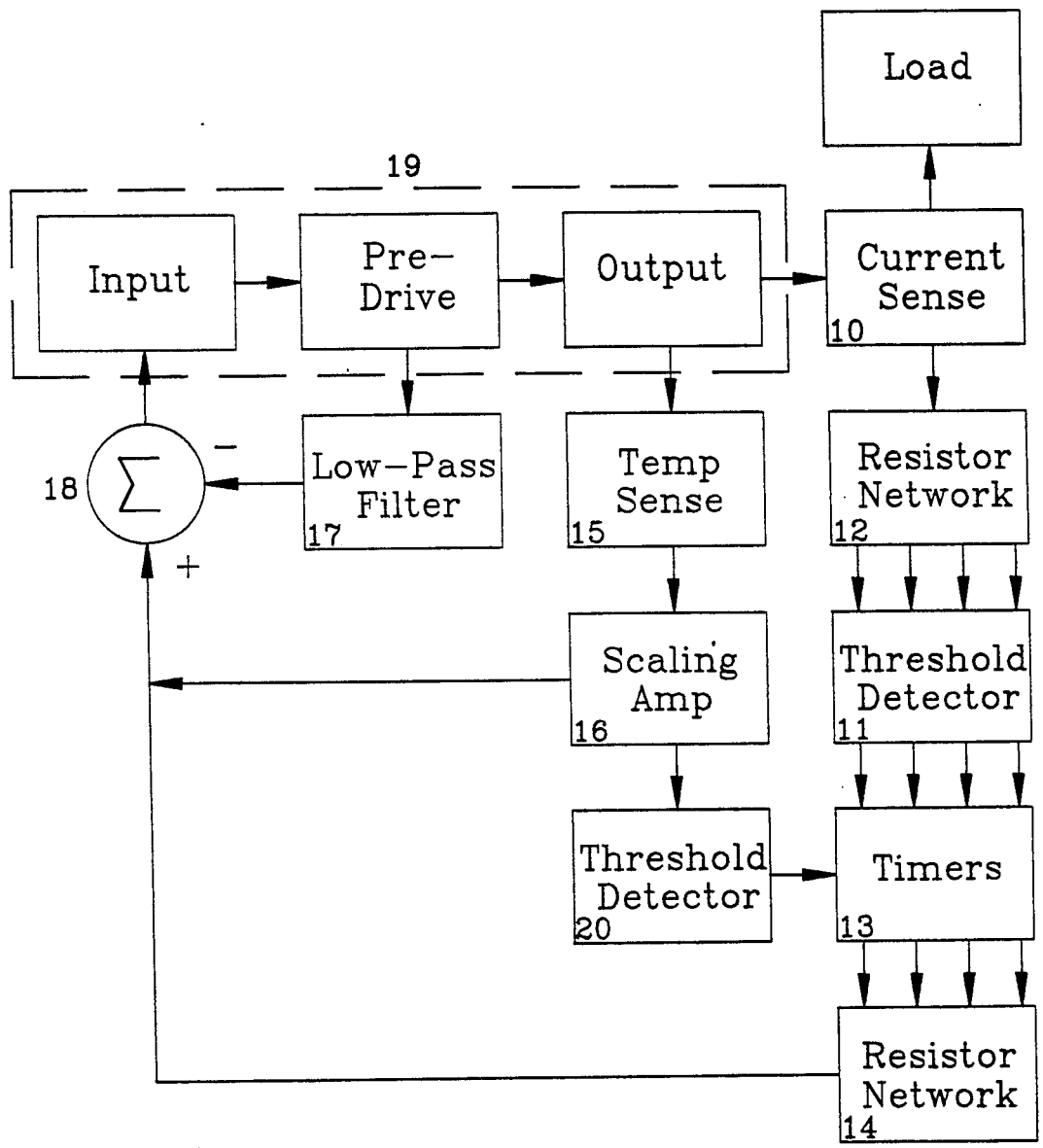
FIG. 1 shows a block diagram of the preferred embodiment of the invention.

Refer to FIG. 1. A conventional audio amplifier is shown as 19. The load current flowing is sensed and linearized in current sensor 10. This signal is coupled to a threshold detector 11 by means of a resistive ladder network 12. The outputs from the threshold detector are coupled to timers 13, whose outputs are further coupled to a resistive ladder output network 14.

The temperature of the output stage devices is measured by a detector 15, and is coupled to a scaling amplifier 16.

The bias current flowing in a predriver stage is sensed and filtered by network 17, and the output from network 17, network 14 and scaling amp 16 is coupled to error amp 18, whose output is coupled to the input of the amplifier 1 to adjust the bias current in the output stage.

Figure 2:
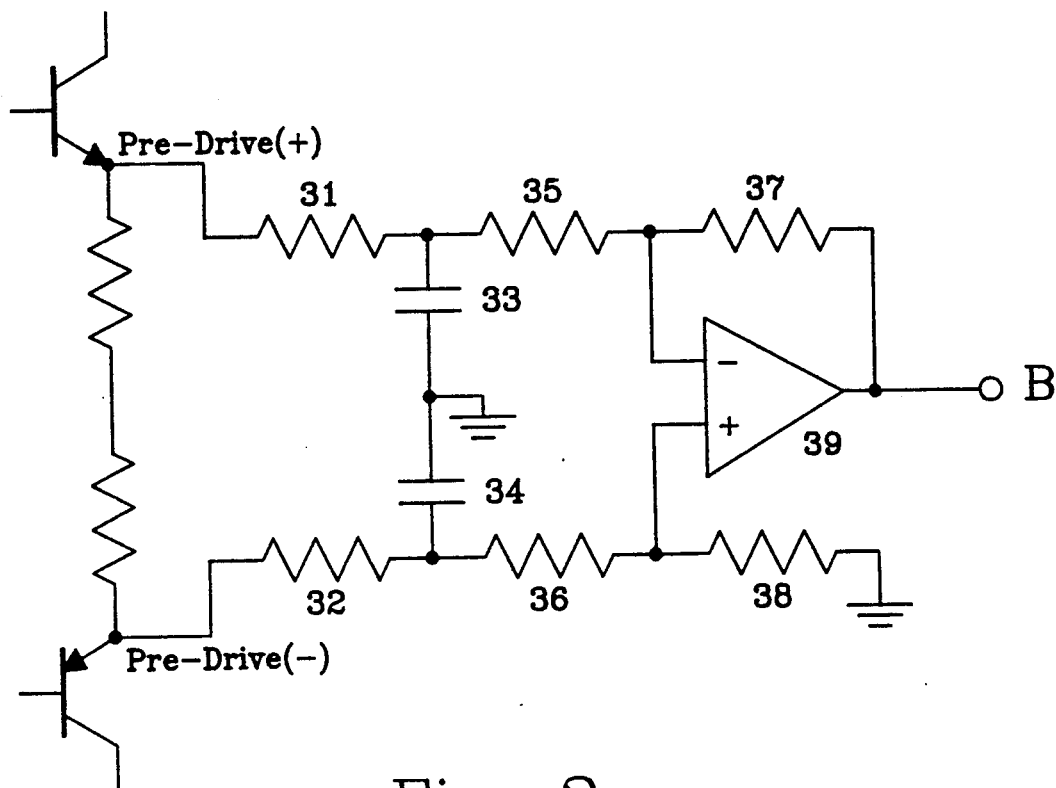
FIG. 2 shows details of a bias measurement circuit.

Refer to FIG. 2. The bias measurement section is a low pass filter which is connected to the outputs of the amplifier's pre-driver stage. The reason for measuring the bias at the pre-driver stage and not the output stage is that the pre-drivers are always operating in class A. This means that any signal passing through the amplifier will not affect the bias reading. Assuming that the base-emitter voltage drop through the drivers and outputs is constant, then the output bias is simply the pre-driver bias minus this voltage drop. Resistors 31, 32 and capacitors 33, 34 form the low pass filter while resistors 35, 36, 37, 38 and operational amplifier 39 form a differential amp which produces a voltage proportional to the bias.

Figure 3:
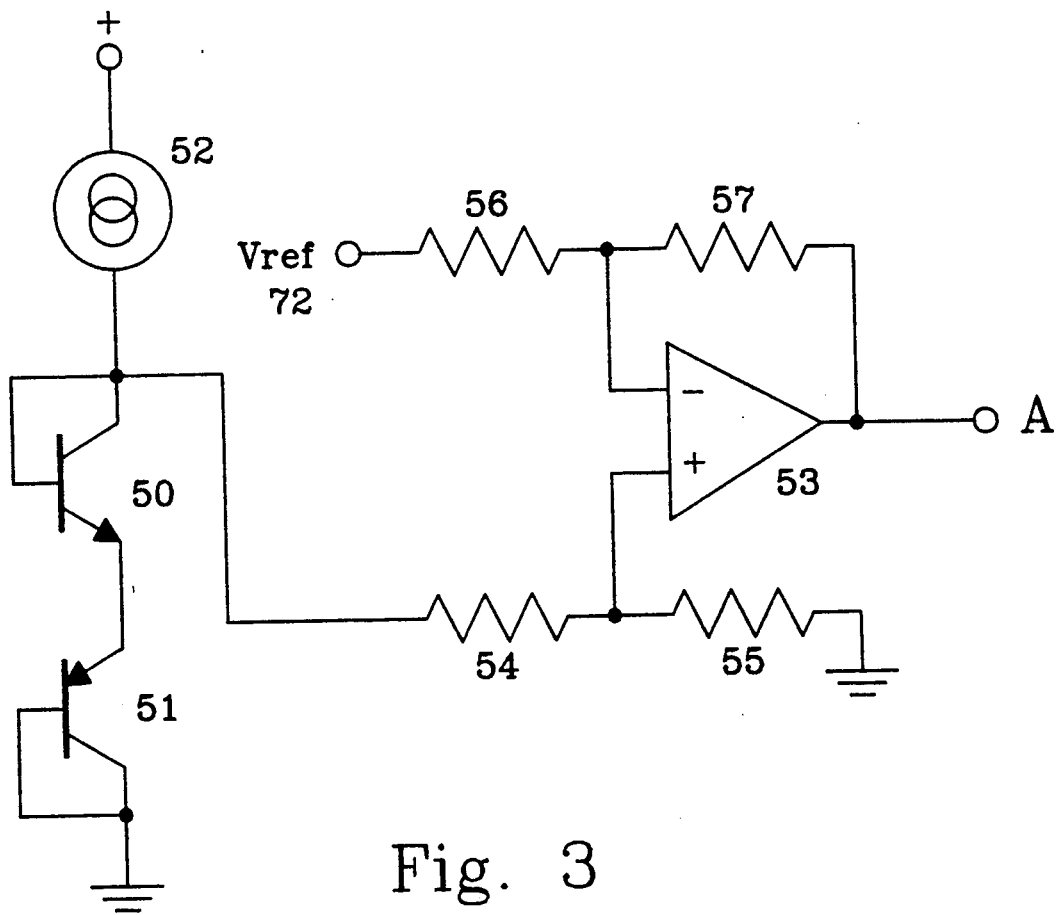
FIG. 3 shows details of a temperature measurement circuit.

Refer to FIG. 3. The temperature measurement circuit consists of two sense transistors, and a scaling amplifier. Transistors 50 and 51 are mounted to the output heatsinks, are supplied by current source 52 and act as temperature sensors. Since the temperature sensor output voltage and the reference voltage are made to be very close at room temperature, they appear as common-mode voltage on the input of operational amplifier 53. Therefore, the output of the differential amp formed by 53 and resistors 54-57 is approximately zero at room temperature. The gain of the differential amp is set so that the rate of decrease of the output voltage cancels the rate of rise of the output bias.

Referring to FIG. 1, it is also possible to use this signal, in conjunction with a threshold detector 20, to generate an over-temperature signal, which may then be used to inhibit the highest bias levels. This can control excessive heating when operating at very high average load currents.

Figure 4:
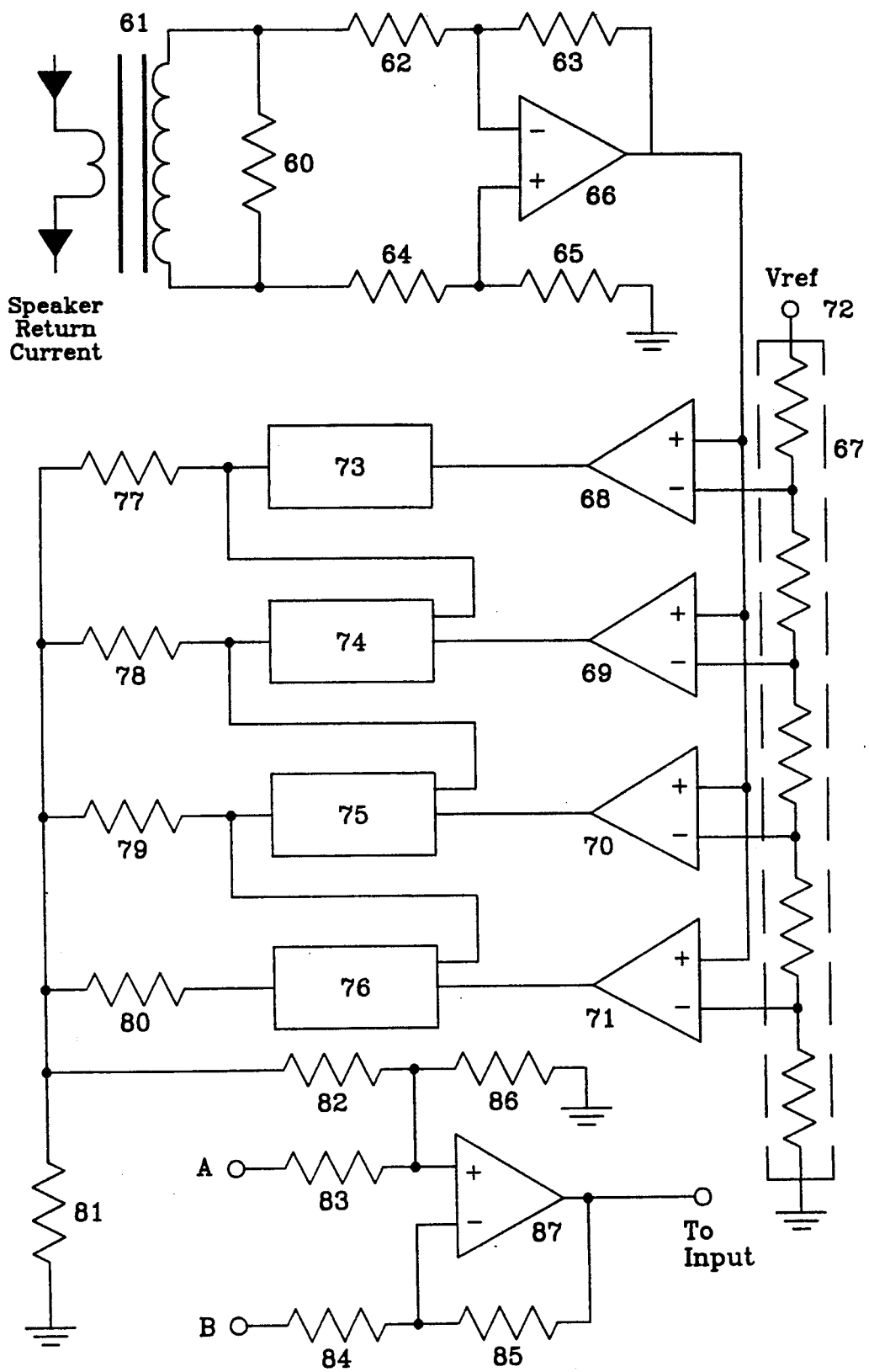
FIG. 4 shows details of the preferred embodiment of the control circuit.

Refer to FIG. 4. The control system consists of an output current monitor, a timer circuit, and an error amp which combines the temperature, timer and pre-driver bias signals. Output current is measured with a current transformer placed in the return path of the speaker terminals. The resistor 60 across the secondaries of the transformer 61 linearizes the output voltage over the audio frequency spectrum (20 Hz-20 kHz). The differential amplifier formed by resistors 62-65 and operational amplifier 66 amplifies the output of the transformer to a level high enough to be used in the comparator section.

Operational amplifiers 68-71 form the threshold detector which compares the output current level to preset levels and generates output signals proportional to the magnitude of the load current. These output signals then trigger the appropriate bias level. The preset levels are derived from the precision voltage reference 72 and the voltage divider network 67 formed by a precision resistor string. In the preferred embodiment, four timers are utilized, as a compromise between more precise control and increased cost.

The heart of the control system is the cascaded re-triggerable timing circuit formed by timers 73-76. Each stage is configured as a monostable with two trigger inputs (except timer 73 which has only the comparator trigger input). Each timer has a time constant selected so that it is inversely proportional to the load current that triggered it. This provides that the higher the bias level, the shorter the time it will be applied, assuming it is not re-triggered. The outputs of each stage are summed in varying proportions by resistors 77-81 to provide the bias set point voltage, such that the voltage is proportional to the load current represented by the previous threshold detector. As long as the output current level exceeds a particular preset level the associated timer and all of the following timers will remain triggered. As soon as the output current drops below a given level, that timer will begin its timing cycle. If the timing cycle ends before a new trigger is received, then the following timer will begin its timing cycle. This sequence will continue until the last timer 76 times out or until a new trigger signal occurs. The timers for the highest bias levels may be inhibited or reset using the over temperature signal that was derived from the temperature measurement circuit. Note that any time the output current exceeds a given level, the associated timer will be re-triggered and the previous sequence will start again. The overall effect is that the bias set point jumps to whatever level is needed, but decreases only one level at a time. The monostable timers can be either analog or digital. Analog designs would use larger values of passive components, especially capacitors. A typical timer would be the industry standard 555 timer integrated circuit. Digital designs require a clocking source, which can introduce electrical noise in the amplifier. The preferred mode is to utilize analog timers to minimize noise.

The error amp formed by resistors 82-86 and operational amplifier 87 sums the temperature, measured bias and timer outputs to provide an error signal back to the input of the amplifier to adjust the bias.

There are many ways to accomplish the same results. The important features are a means for measuring load current, coupled to timers that hold a given bias level for varying times, summed with a bias level established from a pre-driver stage and a temperature signal.

What is claimed is:

1. An electronic circuit for automatically adjusting the bias of an audio amplifier comprising:
   means for sensing the current flowing in the load, coupled to a first threshold detector, said first threshold detector having a plurality of outputs, each of said outputs representing some fraction of maximum load current;

a plurality of timing means, each triggered by one of the plurality of outputs from said first threshold detector, each having a time constant inversely proportional to the fraction of load current represented;

means for summing the outputs of said timing means, directly proportionally to the fraction of load current represented;

means for sensing the operating temperature of the amplifier output stage devices;

means for detecting bias level in a pre-driver stage, coupled to a low pass filter;

an error amplifier, whose inputs are coupled to said temperature sense means, said summing means and said low pass filter; said error amplifier output is then coupled to the input of said audio amplifier to effect the change in bias.

2. The circuit in 1 where said means for sensing the operating temperature of the amplifier output stage devices is coupled to a second threshold detector, said second threshold detector having an output which is enabled above a certain temperature and where said output is used to inhibit the timer means representing the highest fraction of load current.

3. The circuit in 2 where the output of said second threshold detector is used to inhibit both the timing means representing the highest fraction and second highest fraction of load current.

4. The circuit in 3 where said load current sensor is a current transformer coupled to a resistor and a first operational amplifier, whose output is coupled to said first threshold detector.

5. The circuit in 4 where said first threshold detector comprises four comparators whose inputs are coupled to a resistive ladder network, and whose outputs are coupled to the input of said timer means.

6. The circuit in 5 where said timer means comprise retriggerable monostable multivibrators, whose outputs are coupled to a weighted resistor summing network.

7. The circuit in 6 where the temperatures are sensed by the junction temperatures of two transistors thermally connected to the output heatsinks and scaled by a second operational amplifier.

8. The circuit in 7 where the bias current in the pre driver stage is measured by a resistive divider, coupled to a capacitive low pass filter, whose output is scaled by a third operational amplifier.

9. The circuit in 8 where the error amp comprises a fourth operational amplifier whose output is coupled to the amplifier input.

10. A method for automatically adjusting the operating point of an amplifier by varying the bias current comprising:
  a) sensing the current flowing in the load,
  b) comparing the level of the said current with reference to preset levels to generate a plurality of signals,
  c) triggering timers whose time constant is based upon the said signals,
  d) scaling and summing the output of said timers;
  e) measuring the temperature of said amplifier output stage devices;
  f) scaling said temperature measurement;
  g) measuring the bias current in a predriver stage,
  h) low pass filtering and scaling said pre driver bias;
  i) summing said scaled and summed timer outputs, said scaled temperature measurement, and said scaled pre driver bias and
  j) applying said summed value to the input of said amplifier to adjust the bias.

11. The method of 10 further comprising the steps of:
  k) detecting an over temperature condition of said temperature measurement and
  l) inhibiting the higher order timers when said over-temperature condition exists.

* * * * *